(12) United States Patent
Li (10) Patent No.: US 11,917,861 B2
(45) Date of Patent: Feb. 27, 2024

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xue Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 511 days.

(21) Appl. No.: 17/283,054

(22) PCT Filed: Jan. 29, 2021

(86) PCT No.: PCT/CN2021/074375
§ 371 (c)(1),
(2) Date: Apr. 6, 2021

(87) PCT Pub. No.: WO2022/151534
PCT Pub. Date: Jul. 21, 2022

(65) Prior Publication Data
US 2022/0367587 A1    Nov. 17, 2022

(30) Foreign Application Priority Data

Jan. 18, 2021   (CN) .......................... 202110061369.3

(51) Int. Cl.
*H10K 59/131* (2023.01)
*H10K 59/121* (2023.01)
*H10K 50/856* (2023.01)
*H10K 50/86* (2023.01)

(52) U.S. Cl.
CPC ....... *H10K 59/1213* (2023.02); *H10K 50/856* (2023.02); *H10K 50/865* (2023.02); *H10K 59/131* (2023.02)

(58) Field of Classification Search
None
See application file for complete search history.

(56) References Cited

FOREIGN PATENT DOCUMENTS

| CN | 109390377 A | 2/2019 |
|----|-------------|--------|
| CN | 109950282 A | 6/2019 |
| CN | 110379836 A | 10/2019 |
| CN | 110676296 A | 1/2020 |
| CN | 111146261 A | 5/2020 |
| CN | 111146362 A | 5/2020 |
| CN | 111506157 A | 8/2020 |
| CN | 111722444 A | 9/2020 |
| CN | 111739917 A | 10/2020 |
| CN | 111833720 A | 10/2020 |
| CN | 112102783 A | 12/2020 |
| JP | 2018060179 A | 4/2018 |
| WO | 2020100442 A1 | 5/2020 |

*Primary Examiner* — William C Trapanese
(74) *Attorney, Agent, or Firm* — PV IP PC; Wei Te Chung; Zhigang Ma (57) ABSTRACT

A display device is provided, wherein a metal reflective pattern formed at intervals between a plurality of pixel driving circuits is equivalent to or is similar to a first predetermined metal pattern in an area corresponding to the plurality of pixel driving circuits, thereby making reflectance of a transitional display area uniform, and thereby solving a technical problem of uneven brightness in a display device under dark conditions.

15 Claims, 8 Drawing Sheets

DISPLAY DEVICE

FIELD OF INVENTION

The present disclosure relates to a field of display technology, and especially relates to a display device.

BACKGROUND OF INVENTION

Figure 1:
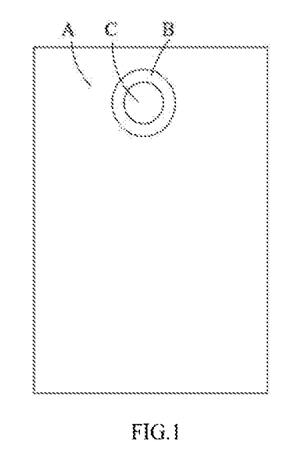
FIG. 1 is a schematic view of a convention active-matrix organic light emitting diode display panel.

As shown in FIG. 1, which is a schematic view of a conventional active-matrix organic light emitting diode (AMOLED) display panel, the active-matrix organic light emitting diode display panel has a normal display area A, a transitional display area B, and a light transmission display area C. The transitional display area B is located between the light transmission display area C and the normal display area A. A plurality of pixel driving circuits and corresponding metal signal wires are disposed in the transitional display area B. A part of the pixel driving circuits located in the transitional display area B are for driving display pixels in the light transmission display area C. In addition, the pixel driving circuits, which drives the display pixels in the light transmission display area C, in the transitional display area B are electrically connected with the display pixels in the light transmission display area C by transparent wires, so that the corresponding pixel driving circuits and the corresponding metal signal wires of the display pixels in the light transmission display area C are disposed outside of the light transmission display area C, thereby ensuring a transmittance of the light transmission display area C, and thereby allowing the light transmission display area C to have dual functions of photography and display. In addition, the plurality of display pixels arranged in array and the corresponding pixel driving circuits are disposed in the normal display area A to achieve display.

In the conventional active-matrix organic light emitting diode display panel, in a screen-off condition and under intense light, an obvious dividing line appears between the transitional display area B and the normal display area A. In conventional techniques, the problem of the dividing line appearing between the transitional display area B and the normal display area A is ameliorated by disposing a metal reflective pattern at intervals between the pixel driving circuits in the transitional display area B and designing the metal reflective pattern according to a metal distribution pattern of the pixel driving circuits in a main display area. However, despite the fact that the technical solution of the conventional technique can ameliorate the problem of the dividing line appearing between the transitional display area B and the normal display area A, there is still a technical problem of uneven brightness existing in the transitional display area B when displaying under dark conditions, which affects display effects.

Therefore, it is necessary to propose a technical solution to solve the technical problem of uneven brightness in the transitional display area B when displaying under dark conditions.

SUMMARY OF INVENTION

Technical Problem

The present disclosure is aimed to provide a display device, thereby ameliorating a technical problem of uneven brightness in a transitional display area when the display device displays under dark conditions.

Technical Solution

Specific solution for achieving the aforementioned goal is as follow:

A display device, wherein the display device has a transitional display area and a display light transmission area, the transitional display area is disposed at a periphery of the display light transmission area, the display device comprises:
- display pixels disposed in the transitional display area and the display light transmission area;
- a plurality of pixel driving circuits disposed in the transitional display area, for driving the display pixels in the transitional display area and the display light transmission area to emit light; and
- a metal reflective pattern disposed in the transitional display area and located at intervals between the plurality of pixel driving circuits;
- wherein a first predetermined metal pattern is disposed in an area corresponding to the plurality of pixel driving circuits, and the metal reflective pattern is equivalent to or is similar to the first predetermined metal pattern.

Beneficial Effect

The display device is provided, wherein the metal reflective pattern formed at the intervals between the plurality of pixel driving circuits is equivalent to or is similar to the first predetermined metal pattern in the area corresponding to the plurality of pixel driving circuits, thereby making a reflectance of the area in which the plurality of pixel driving circuits are located and a reflectance of the intervals between the plurality of pixel driving circuits equal to each other, thereby making a reflectance of the transitional display area uniform, and thereby solving the technical problem of uneven brightness in the display device when displaying under dark conditions.

DETAILED DESCRIPTION OF PREFERRED EMBODIMENTS

In the following description, the technical solutions in the embodiments of the present disclosure are described clearly and completely in conjunction with the drawings in the embodiments of the present disclosure. Obviously, the embodiments described herein are only a part of the embodiments of the present disclosure instead of all embodiments of the present disclosure. Based on the embodiments in the present disclosure, all other embodiments obtained by those skill in the art without making creative effort fall within the scope of protection of the present disclosure.

A cause of the problem of uneven brightness in a transitional display area when displaying under dark conditions is as follows: In the transitional display area, metal is concentrated in an area which pixel driving circuits are located, and less or no metal is disposed in areas between the plurality of pixel driving circuits. Therefore, a large difference exists between a reflectance of an area corresponding to the pixel driving circuits and a reflectance of the areas between the plurality of pixel driving circuits. The large difference in reflectance causes the technical problem of the transitional display area having uneven brightness when displaying under dark conditions. Therefore, in the present disclosure, by disposing a metal reflective pattern at intervals between the pixel driving circuits, so as to increase a reflectance of the intervals between the pixel driving circuits, and by making the metal reflective pattern equivalent to or similar to a first predetermined metal pattern disposed in the area corresponding to the plurality of pixel driving circuits in the transitional display area, so as to make a design of the metal reflective pattern equivalent to a design of metal in the area corresponding to the pixel driving circuits in the transitional display area, the reflectance of the area corresponding to the pixel driving circuits is made equal to the reflectance of the areas between the plurality of pixel driving circuits, the reflectance of the transitional display area is made uniform, and the problem of uneven brightness in the transitional display area when displaying under dark condition is ameliorated.

The present disclosure provides a display device, which may be a liquid crystal display device or an organic light emitting diode display device. Specifically, the display device is the organic light emitting diode display device.

Figure 2:
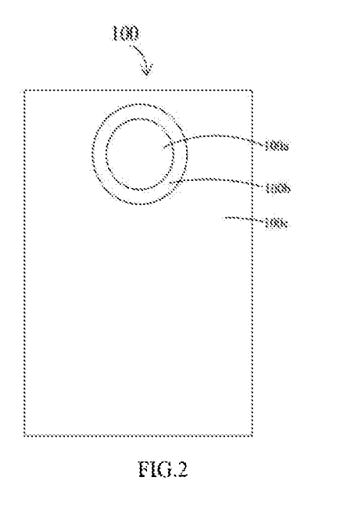
FIG. 2 is a schematic plan view of a display device of an embodiment of the present disclosure.

As shown in FIG. 2, which is a schematic plan view of the display device of an embodiment of the present disclosure, a display device 100 comprises a display light transmission area 100a, a main display area 100c, and a transitional display area 100b. The transitional display area 100b is disposed at a periphery of the display light transmission area 100a and is located between the main display area 100c and the display light transmission area 100a. Both the main display area 100c and the transitional display area 100b are for display. Besides being used for display, the display light transmission area 100a is also highly transmissive. A transmittance of the display light transmission area 100a is higher than a transmittance of the main display area 100c and a transmittance of the transitional display area 100b. An area of the main display area 100c is larger than an area of an area of the transitional display area 100b and an area of the display light transmission area 100a. The display light transmission area 100a is round, and the transitional display area 100b is circular.

The display device 100 comprises a plurality of first display pixels, a plurality of second display pixels, a plurality of first pixel driving circuits 104, a plurality of second pixel driving circuits 1011, and a plurality of transparent wires 102.

Figure 3:
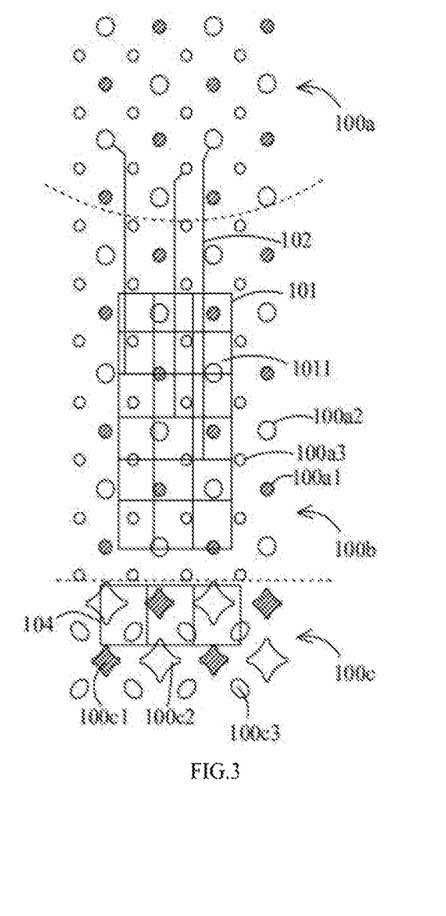
FIG. 3 is a partial enlarged schematic view of the display device shown in FIG. 2.

As shown in FIG. 3, which is a partial enlarged schematic view of the display device of an embodiment of the present discourse, the plurality of first display pixels are evenly disposed in the main display area 100c. Each of the first display pixels includes a first red subpixel 100c1, a first green subpixel 100c3, and a first blue subpixel 100c2. The first red subpixel 100c1, the first green subpixel 100c3, and the first blue subpixel 100c2 are arranged in a pentile arrangement in the main display area 100c. The first green subpixel 100c3 is oval, and both the first red subpixel 100c1 and the first blue subpixel 100c2 are octagonal.

The plurality of second display pixels are evenly disposed in the display light transmission area 100a and the transitional display area 100b. Each of the second display pixels includes a second red subpixel 100a1, a second green subpixel 100a3, and a second blue subpixel 100a2. The second red subpixel 100a1, the second green subpixel 100a3, and the second blue subpixel 100a2 are arranged in the pentile arrangement in both the display light transmission area 100a and the transitional display area 100b. The second red subpixel 100a1, the second green subpixel 100a3, and the second blue subpixel 100a2 are round.

In the present embodiment, the first red subpixel 100c1, the first green subpixel 100c3, the first blue subpixel 100c2, the second red subpixel 100a1, the second green subpixel 100a3, and the second blue subpixel 100a2 all includes light emitting devices. The light emitting devices are organic light emitting diodes. Each of the organic light emitting diodes includes an anode, a cathode, and an organic light emitting layer disposed between the anode and the cathode.

In the present embodiment, a size of the first red subpixel 100c1 is larger than a size of the second red subpixel 100a1, a size of the first green subpixel 100c3 is larger than a size of the second green subpixel 100a3, and a size of the first blue subpixel 100c2 is larger than a size of the second blue subpixel 100a2, thereby ensuring a high transmittance of the display light transmission area 100a. The sizes of the subpixels decrease from the main display area 100c to the transitional display area 100b.

In the present embodiment, the plurality of first pixel driving circuits 104 are disposed in the main display area 100c as an array. Each of the first pixel driving circuits 104 correspondingly drives one of the subpixels (one of the first red subpixel 100c1, the first green subpixel 100c3, and the first blue subpixel 100c2) in the main display area 100c to emit light. Specifically, the plurality of first pixel driving circuits 104 are arranged in an array formed by rows and columns. Each of the first pixel driving circuits 104 includes a plurality of metal layers, and the plurality of first pixel driving circuits 104 are disposed in the main display area 100c in an array, thereby making the main display area 100c high in reflectance and low in transmittance.

In the present embodiment, the plurality of second pixel driving circuits 1011 are disposed in the transitional display area 100b. The plurality of second pixel driving circuits 1011 are for driving the second display pixels in the display light transmission area 100a and in the transitional display area 100b. That is, the second pixel driving circuits 1011 are also used for driving the second display pixels in the display light transmission area 100a to emit light while being used for driving the second display pixels in the transitional display area 100b to emit light, thereby avoiding disposing pixel driving circuits in the display light transmission area 100a, thereby preventing the metal layers of the pixel driving circuits from affecting the transmittance of the display light transmission area 100a, and thereby further increasing the transmittance of the display light transmission area 100a. The plurality of second pixel driving circuits 1011 are electrically connected with the second red subpixel 100al, the second blue subpixel 100a2, and the second green subpixel 100a3 of the display light transmission area 100a by the plurality of transparent wires 102.

Specifically, multiple second pixel driving circuits 1011 form a pixel driving circuit island 101. Each of the pixel driving circuit islands 101 includes m rows and n columns of the second pixel driving circuits 1011. m is greater than or equal to 2, and n is greater than or equal to 2. That is, each of the pixel driving circuit islands 101 is in a shape of a stripe. The pixel driving circuit island 101 refers to multiple second pixel driving circuits 1011 disposed in an island-like aggregation.

Figure 4:
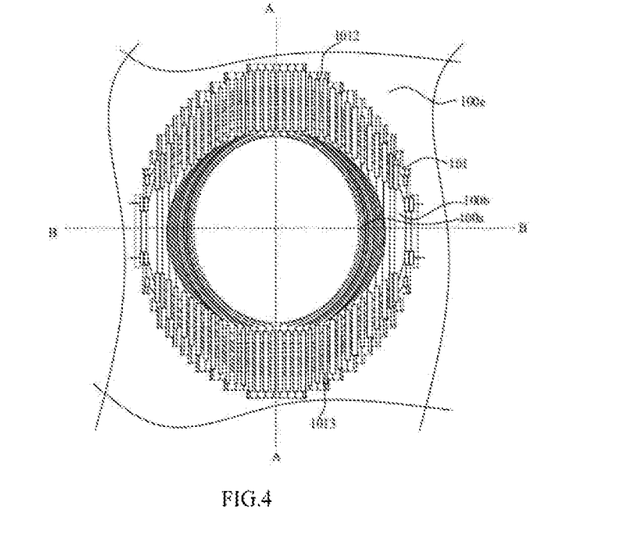
FIG. 4 is a partial enlarged schematic view of the display device shown in FIG. 3.

As shown in FIG. 4, a plurality of pixel driving circuit islands 101 are disposed around the display light transmission area 100a and are disposed at intervals. Numbers of the second pixel driving circuits 1011 in at least two of the pixel driving circuit islands 101 are different. The areas between the plurality of second pixel driving circuits 1011 includes areas between adjacent two of the pixel driving circuit islands 101, areas between the pixel driving circuit islands 101 and the main display area 100c, and areas between the pixel driving circuit islands 101 and the display light transmission area 100a.

The plurality of pixel driving circuit islands 101 includes a first pixel driving circuit island group 1012 (pixel driving circuit islands 101 above an axis of symmetry B-B) and a second pixel driving circuit island group 1013 (pixel driving circuit islands 101 under the axis of symmetry B-B). The pixel driving circuit islands 101 of the first pixel driving circuit island group 1012 and the pixel driving circuit islands 101 of the second pixel driving circuit island group 1013 are disposed symmetrically about the axis of symmetry B-B. The pixel driving circuit islands 101 of the first pixel driving circuit island group 1012 are disposed symmetrically about an axis of symmetry A-A. The pixel driving circuit islands 101 of the second pixel driving circuit island group 1013 are disposed symmetrically about the axis of symmetry A-A.

In the present embodiment, the first pixel driving circuit 104 can be any one of a 2T1C circuit, a 3T1C circuit, a 4T1C circuit, a 5T1C circuit, a 6T1C circuit, and a 7T1C circuit. The second pixel driving circuit 1011 can be any one of the 2T1C circuit, the 3T1C circuit, the 4T1C circuit, the 5T1C circuit, the 6T1C circuit, and the 7T1C circuit. The first pixel driving circuits 104 and the second pixel driving circuits 1011 may adopt a same circuit design, or may adopt different circuit designs.

Specifically, the first pixel driving circuits 104 and the second pixel driving circuits 1011 adopt the same circuit design. Because a size of a single second red subpixel 100a1 and a size of a single first red subpixel 100c1 are different, each of the second red subpixel 100a1 and the first red subpixel 100c1 correspond to a driving circuit having a driving power, which is different from the driving power of the other driving circuit. Similarly, a driving power of a driving circuit of the first green subpixel 100c3 and a driving power of a driving circuit of the second green subpixel 100a3 are different from each other, and a driving power of a driving circuit of the first blue subpixel 100c2 and a driving power of a driving circuit of the second blue subpixel 100a2 are also different from each other. Therefore, the first pixel driving circuits 104 may only be used for driving the first red subpixel 100c1, the first green subpixel 100c3, and the first blue subpixel 100c2 in the main display area 100c, and the second pixel driving circuits 1011 may only be used for driving the second red subpixel 100al, the second green subpixel 100a3, and the second blue subpixel 100a2 in the transitional display area 100b and in the display light transmission area 100a. Differences between the first pixel driving circuits 104 and the second pixel driving circuits 1011 include differences in device size and in wire size.

Figure 5:
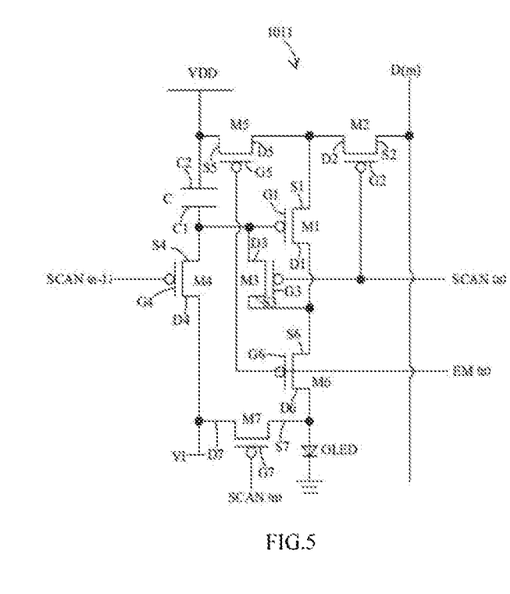
FIG. 5 is a schematic circuit diagram of a first pixel driving circuit and a second pixel driving circuit.

As shown in FIG. 5, which is a schematic circuit diagram of the first pixel driving circuit and the second pixel driving circuit, for the convenience of description, the present disclosure takes the second pixel driving circuits as an example for description.

Each of the second pixel driving circuits 1011 includes a driving transistor M1, a switch transistor M2, a compensation transistor M3, an initialization transistor M4, a first light emission control transistor M5, a second light emission control transistor M6, an anode reset transistor M7, and a capacitor C. The driving transistor M1, the switch transistor M2, the compensation transistor M3, the initialization transistor M4, the first light emission control transistor M5, the second light emission control transistor M6, and the anode reset transistor M7 are all p-type transistors.

The display device 100 also comprises a plurality of wires electrically connected with the second pixel driving circuits 1011. The plurality of wires includes following wires disposed in the transitional display area 100b: a n-$1^{th}$ level scan signal wire SCAN(n-1), a $n^{th}$ level scan signal wire SCAN (n), a data wire D(m), an initialization signal wire VI, a DC power signal wire VDD, and a $n^{th}$ level light emission control signal wire EM(n). The n-$1^{th}$ level scan signal wire SCAN(n-1) is used for transmitting n-$1^{th}$ level scan signals. The $n^{th}$ level scan signal wire SCAN(n) is used for transmitting $n^{th}$ level scan signals. The data wire D(m) is used for transmitting data signals. The DC power signal wire VDD is used for transmitting DC power signals. The $n^{th}$ level light emission control signal wire EM(n) is for transmitting $n^{th}$ level light emission control signals. The initialization signal wire VI transmits initialization signals or reset signals.

A gate G1 of the driving transistor M1 is connected with a first electrode plate C1 of the capacitor C, a drain D3 of the compensation transistor M3, and a source S4 of the initialization transistor M4. A source S1 of the driving transistor M1 is connected with the DC power signal wire VDD through the first light emission control transistor M5, the source S1 of the driving transistor M1 is connected with the data wire D(m) through the switch transistor M2, and a drain D1 of the driving transistor M1 is connected with a light emitting device OLED through the second light emission control transistor M6. When the switch transistor M2 is in an on-state, the driving transistor M1 receives data signals transmitted by the data wire D(m) and provides driving current for the light emitting device OLED.

A gate G2 of the switch transistor M2 is connected with the $n^{th}$ level scan signal wire SCAN(n), a source S2 of the switch transistor M2 is connected with the data wire D(m), and a drain D2 of the switch transistor M2 is connected with the source S1 of the driving transistor M1. The drain D2 of the switch transistor M2 is also connected with the DC power signal wire VDD through the first light emission control transistor M5. The switch transistor M2 is switched to the on-state or to an off-state according to the $n^{th}$ level scan signals transmitted by the $n^{th}$ level scan signal wire SCAN(n), thereby controlling whether the data signals transmitted by the data wire D(m) are read into the source S1 of the driving transistor M1.

A gate G3 of the compensation transistor M3 is connected with the $n^{th}$ level scan signal wire SCAN(n), a source S3 of the compensation transistor M3 is connected with the drain D1 of the driving transistor M1, and the source S3 of the compensation transistor M3 is also connected with the light emitting device OLED through the second light emission control transistor M6. A drain D3 of the compensation transistor M3 is connected with the gate G1 of the driving transistor M1, the source S4 of the initialization transistor M4, and the first electrode plate C1 of the capacitor C. The compensation transistor M3 is switched to the on-state according to the $n^{th}$ level scan signals transmitted by the $n^{th}$ level scan signal wire SCAN(n), and electrically connects the gate G1 of the driving transistor M1 and the drain D1 of the driving transistor M1.

A gate G4 of the initialization transistor M4 is connected with the $n-1^{th}$ level scan signal wire SCAN(n-1), a drain D4 of the initialization transistor M4 is connected with a drain D7 of the anode reset transistor M7 and with the initialization signal wire VI, and the source S4 of the initialization transistor M4 is connected with the gate G1 of the driving transistor M1, the drain D3 of the compensation transistor M3, and the first electrode plate C1 of the capacitor C. The initialization transistor M4 is switched to the on-state or to the off-state according to the $n-1^{th}$ level scan signals transmitted by the $n-1^{th}$ level scan signal wire SCAN(n-1), thereby controlling whether the initialization signals transmitted by the initialization signal wire VI are read into the gate G1 of the driving transistor M1.

A gate G5 of the first light emission control transistor M5 is connected with the $n^{th}$ level light emission control signal wire EM(n), a source S5 of the first light emission control transistor M5 is connected with the DC power signal wire VDD and with a second electrode plate C2 of the capacitor C, and a drain D5 of the first light emission control transistor M5 is connected with the source S1 of the driving transistor M1 and with the drain D2 of the switch transistor M2. The first light emission control transistor M5 is switched to the on-state or to the off-state according to the nth level light emission control signals transmitted by the $n^{th}$ level light emission control signal wire EM(n), thereby controlling whether the DC power signals transmitted by the DC power signal wire VDD are read into the source S1 of the driving transistor M1.

A gate G6 of the second light emission control transistor M6 is connected with the $n^{th}$ level light emission control signal wire EM(n), a source S6 of the second light emission control transistor M6 is connected with the drain D1 of the driving transistor M1 and with the source S3 of the compensation transistor M3, and a drain D6 of the second light emission control transistor M6 is connected with an anode of the light emitting device OLED. The second light emission control transistor M6 is switched to the on-state or to the off-state according to the $n^{th}$ level light emission control signals transmitted by the $n^{th}$ level light emission control signal wire EM(n), thereby controlling whether the driving circuit flows into the light emitting device OLED.

A gate G7 of the anode reset transistor M7 is connected with the $n^{th}$ level scan signal wire SCAN(n), the drain D7 of the anode reset transistor M7 is connected with the drain D4 of the initialization transistor M4 and with the initialization signal wire VI, and a source S7 of the anode reset transistor M7 is connected with the anode of the light emitting device OLED and with the drain D6 of the second light emission control transistor M6. The anode reset transistor M7 is switched to the on-state or to the off-state according to the $n^{th}$ level scan signals transmitted by the $n^{th}$ level scan signal wire SCAN(n), thereby controlling whether the initialization signals transmitted by the initialization signal wire VI are read into the anode of the light emitting device OLED.

The first electrode plate C1 of the capacitor C is connected with the gate G1 of the driving transistor M1, the source S4 of the initialization transistor M4, and the drain D3 of the compensation transistor M3. The second electrode plate C2 of the capacitor C is connected with the DC power signal wire VDD and the source S5 of the first light emission control transistor M5. The capacitor C is used for maintaining a voltage that drives the gate of the driving transistor M1 while the driving transistor M1 drives the light emitting device OLED to emit light.

Figure 6:
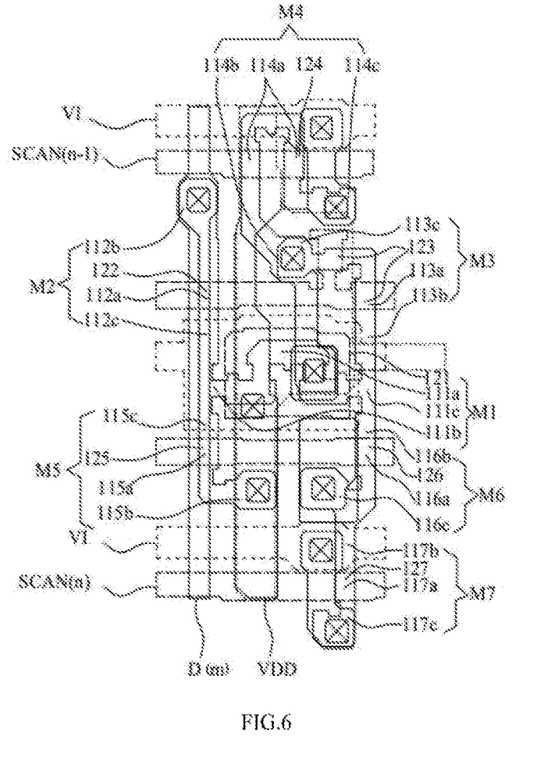
FIG. 6 is a schematic view of a plurality of layers in an area corresponding to the second pixel driving circuit.
Figure 7:
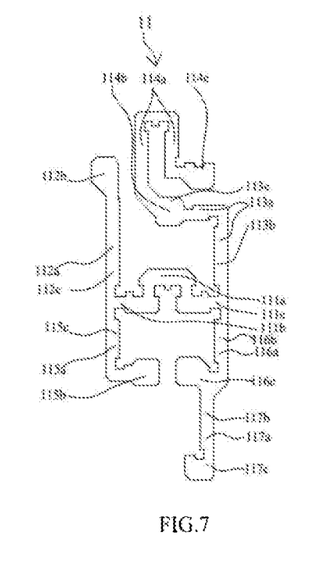
FIG. 7 is a schematic view of a patterned semiconductor layer shown in FIG. 6.
Figure 8:
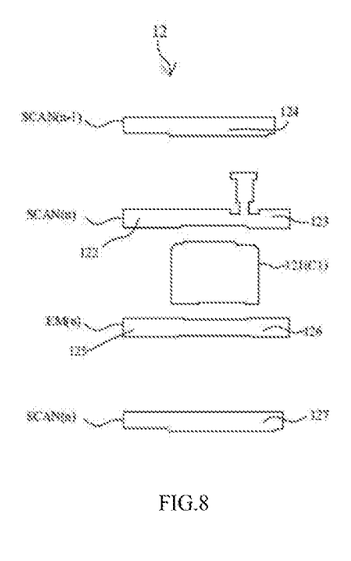
FIG. 8 is a schematic view of a patterned first metal layer shown in FIG. 6.
Figure 9:
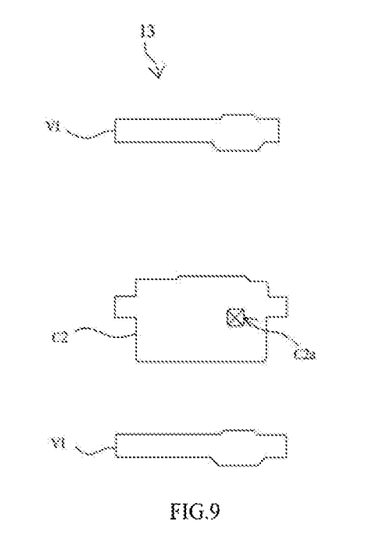
FIG. 9 is a schematic view of a patterned second metal layer shown in FIG. 6.
Figure 10:
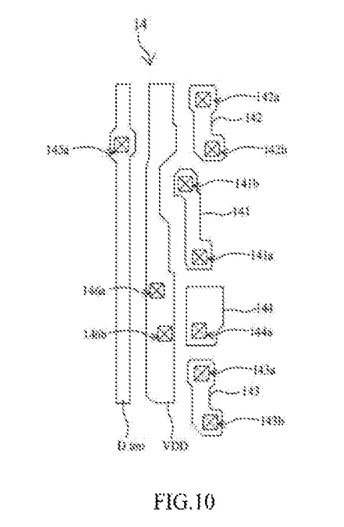
FIG. 10 is a schematic view of a patterned third metal layer shown in FIG. 6.
Figure 11:
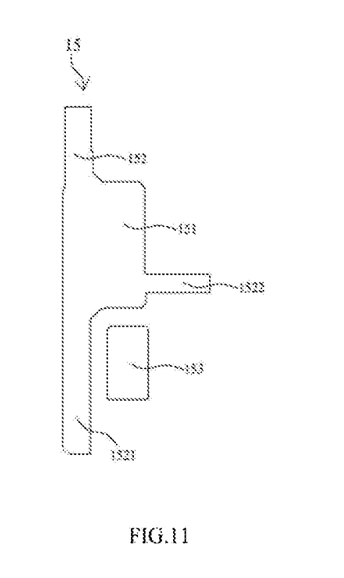
FIG. 11 is a schematic view of a patterned fourth metal layer shown in FIG. 6.
Figure 12:
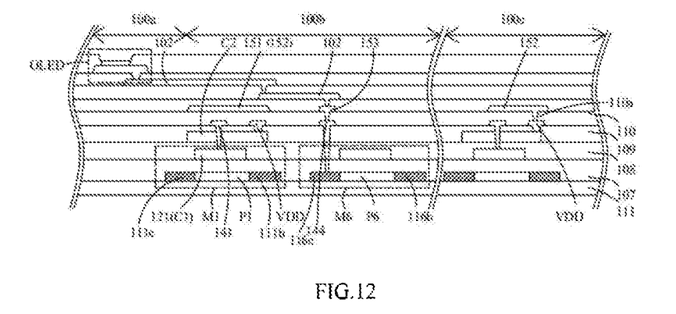
FIG. 12 is a sectional schematic view of the display device shown in FIG. 2.
Figure 13:
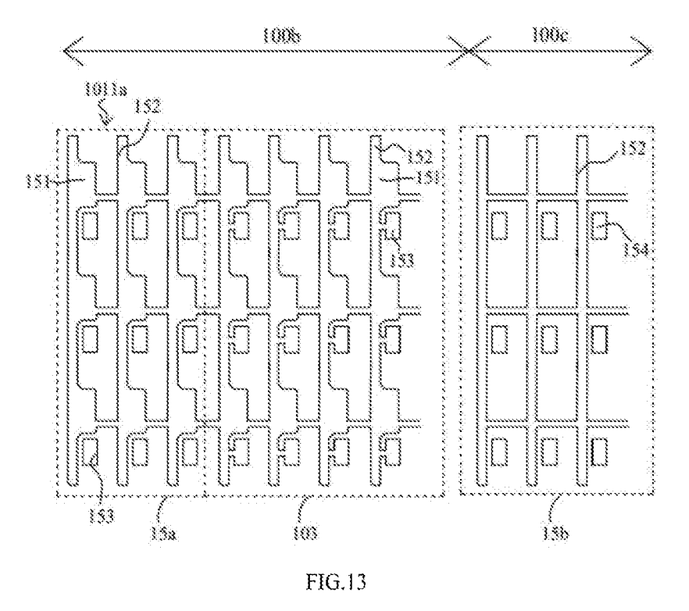
FIG. 13 is a schematic view of a second predetermined metal pattern in a main display area, a metal reflective pattern in a transitional display area, and the patterned fourth metal layer in an area corresponding to a plurality of second pixel driving circuits in the transitional display area.

As shown in FIG. 6 to FIG. 13, wherein FIG. 6 is a schematic view of a plurality of film layers in an area corresponding to the second pixel driving circuit, FIG. 7 is a schematic view of a patterned semiconductor layer shown in FIG. 6, FIG. 8 is a schematic view of a patterned first metal layer shown in FIG. 6, FIG. 9 is a schematic view of a patterned second metal layer shown in FIG. 6, FIG. 10 is a schematic view of a patterned third metal layer shown in FIG. 6, FIG. 11 is a schematic view of a patterned fourth metal layer shown in FIG. 6, FIG. 12 is a sectional schematic view of the display device shown in FIG. 2, and FIG. 13 is a schematic view of a second predetermined metal pattern in the main display area, the metal reflective pattern in the transitional display area, and the patterned fourth metal layer in the area corresponding to the plurality of second pixel driving circuits in the transitional display area.

As shown in FIG. 7, a patterned semiconductor layer 11 includes a driving channel 111a of the driving transistor M1, a switch channel 112a of the switch transistor M2, a compensation channel 113a of the compensation transistor M3, an initialization channel 114a of the initialization transistor M4, a first light emission control channel 115a of the first light emission control transistor M5, a second light emission control channel 116a of the second light emission control transistor M6, and an anode reset channel 117a of the anode reset transistor M7. The driving channel 111a, the switch channel 112a, the compensation channel 113a, the initialization channel 114a, the first light emission control channel 115a, the second light emission control channel 116a, and the anode reset channel 117a are all disposed in a same layer. A material used for preparing the patterned semiconductor layer 11 can be polycrystalline silicon.

The patterned semiconductor layer 11 also includes a driving source 111b and a driving drain 111c of the driving transistor M1. The patterned semiconductor layer 11 also includes a switch source 112b and a switch drain 112c of the switch transistor M2. The patterned semiconductor layer 11 also includes a compensation source 113b and a compensation drain 113c of the compensation transistor M3. The patterned semiconductor layer 11 also includes an initialization source 114b and an initialization drain 114c. The patterned semiconductor layer 11 also includes a first light emission control source 115b and a first light emission control drain 115c of the first light emission control transistor M5. The patterned semiconductor layer 11 also includes a second light emission control source 116b and a second light emission control drain 116c of the second light emission control transistor M6. The patterned semiconductor layer 11 also includes an anode reset source 117b and an anode reset drain 117c of the anode reset transistor M7. The sources and the drains on the patterned semiconductor layer 11 are obtained by doping an active layer for achieving conductorization.

The patterned semiconductor layer 11 is disposed on a substrate 111. As shown in FIG. 12, a driving active layer P1 of the driving transistor M1 and a second light emission control active layer P6 of the second light emission control transistor M6 are both disposed on the substrate 111. The driving source 111b and the driving drain 111c are respectively formed on opposite ends of the driving active layer P1 of the driving transistor M1 by doping, the second light emission control source 116b and the second light emission control drain 116c are respectively formed on opposite ends of the second light emission control active layer P6 of the second light emission control transistor M6 by doping, and a compensation active layer (not shown) of the compensation transistor M3 is disposed in a same layer as the driving active layer P1.

As shown in FIG. 8, a patterned first metal layer 12 includes a driving gate 121 of the driving transistor M1, which is also the first electrode plate C1 of the capacitor. A switch gate 122 of the switch transistor M2 and a compensation gate 123 of the compensation transistor M3 are both part of the $n^{th}$ level scan signal wire SCAN(n). An initialization gate 124 of the initialization transistor M4 is a part of the $n-1^{th}$ level scan signal wire SCAN(n-1). A first light emission control gate 125 of the first light emission control transistor M5 and the second light emission control gate 126 of the second light emission control transistor M6 are both part of the $n^{th}$ level light emission control signal wire EM(n). An anode reset gate 127 of the anode reset transistor M7 is a part of the $n^{th}$ level scan signal wire SCAN(n). The $n-1^{th}$ level scan signal wire SCAN(n-1), the $n^{th}$ level light emission control signal wire EM(n), the two $n^{th}$ level scan signal wire SCAN(n), and the driving gate 121 of the driving transistor M1 all belongs to the patterned first metal layer 12. The $n-1^{th}$ level scan signal wire SCAN(n-1), the $n^{th}$ level light emission control signal wire EM(n), and the $n^{th}$ level scan signal wires SCAN(n) are all disposed parallel to one another. The driving gate 121 of the driving transistor M1 is rectangular. Materials used for preparing the patterned first metal layer 12 include at least one of molybdenum, aluminum, titanium, and copper.

As shown in FIG. 12, a first insulation layer 107 is disposed between the patterned semiconductor layer shown in FIG. 7 and the patterned first metal layer shown in FIG. 8, and the patterned first metal layer shown in FIG. 8 is disposed on the first insulation layer 107. Specifically, the driving gate 121 is disposed in a same layer as the second light emission control gate and is disposed on the first insulation layer 107. The driving gate 121 is disposed above the driving active layer P1. The compensation gate of the compensation transistor M3 is disposed in a same layer as the driving gate 121.

As shown in FIG. 9, a patterned second metal layer 13 includes two initialization signal wires VI and the second electrode plate C2. The second electrode plate C2 is disposed corresponding to the driving gate 121 of the driving transistor M1, and the driving gate 121 and the second electrode plate C2 forms a capacitor. A through hole C2a is formed in the second electrode plate C2. Materials used for preparing the patterned second metal layer 13 include at least one of molybdenum, aluminum, titanium, and copper.

As shown in FIG. 12, a second insulation layer 108 is disposed between the patterned first metal layer shown in FIG. 8 and the patterned second metal layer shown in FIG. 9, and the patterned second metal layer 13 is disposed on the second insulation layer 108. Specifically, the second electrode plate C2 is disposed on the second insulation layer 108 and is located right above the first electrode plate C1.

As shown in FIG. 10 and FIG. 12, a third insulation layer 109 is disposed between the patterned second metal layer 13 shown in FIG. 9 and the patterned third metal layer 14 shown in FIG. 10, and the patterned third metal layer 14 is disposed on the third insulation layer 109. The patterned third metal layer 14 includes a gate leading wire 141, a first initialization leading wire 142, a second initialization leading wire 143, the data wire D(m), the DC power signal wire VDD, and a first anode leading wire 144.

The gate leading wire 141 is located above the driving transistor M1, and the gate leading wire 141 is located above the second electrode plate C2. One end of the gate leading wire 141 is electrically connected with the driving gate 121 of the driving transistor M1 through a first through hole 141a penetrating the third insulation layer 109, the second insulation layer 108, and the second electrode plate C2. Other end of the gate leading wire 141 is electrically connected with the compensation drain of the compensation transistor M3 through a second through hole 141b penetrating the third insulation layer 109, the first insulation layer 107, and the second insulation layer 108.

One end of the first initialization leading wire 142 is electrically connected with the initialization signal wire VI through a third through hole 142a penetrating the third insulation layer 109. Other end of the first initialization leading wire 142 is electrically connected with the initialization drain 114c of the initialization transistor M4 through a fourth through hole 142b penetrating the third insulation layer 109, the second insulation layer 108, and the first insulation layer 107.

One end of the second initialization leading wire 143 is electrically connected with the initialization signal wire VI through a fifth through hole 143a penetrating the third insulation layer 109, and other end of the second initialization leading wire 143 is electrically connected with the anode reset drain 117c of the anode reset transistor M7 through a sixth through hole 143b penetrating the third insulation layer 109, the second insulation layer 108, and the first insulation layer 107.

The first anode leading wire 144 is electrically connected with the second light emission control drain 116c of the second light emission control transistor M6 through a seventh through hole 144a penetrating the third insulation layer 109, the second insulation layer 108, and the first insulation layer 107.

The data wire D(m) is electrically connected with the switch source 112b of the switch transistor M2 through an eighth through hole 145a penetrating the third insulation layer 109, the second insulation layer 108, and the first insulation layer 107. The DC power signal wire VDD is electrically connected with the first light emission control source 115b of the first light emission control transistor M5 through a ninth through hole 146b penetrating the third insulation layer 109, the second insulation layer 108, and the first insulation layer 107.

The DC power signal wire VDD inputs and transmits the DC power signals and is electrically connected with the second electrode plate C2 through a tenth through hole 146a penetrating the third insulation layer 109, thereby inputting the DC power signals into the second electrode plate C2. The DC power signal wire VDD is disposed parallel to the data wire D(m), and the data wire D(m) perpendicularly intersects with the initialization signal wire VI and the $n^{th}$ level scan signal wire SCAN(n).

As shown in FIG. 11 to FIG. 13, a fourth insulation layer 110 is disposed between the patterned third metal layer shown in FIG. 10 and a patterned fourth metal layer 15 shown in FIG. 11. The patterned fourth metal layer 15 is disposed on the fourth insulation layer 110. The patterned fourth metal layer 15 is located above the second pixel driving circuits 1011. Each of a plurality of patterned fourth metal layer 15 in an area 1011a corresponding to the plurality of second pixel driving circuits 1011 includes a metal grid pattern 152, a metal shielding pattern 151, and a second anode leading wire 153. Materials of the patterned fourth metal layer 15 include at least one of molybdenum, aluminum, titanium, and copper.

The metal grid pattern 152 is used for transmitting the DC power signals. The metal grid pattern 152 includes a vertical extending portion 1521 and a horizontal extending portion 1522. The vertical extending portion 1521 and the horizontal extending portion 1522 perpendicularly intersect each other and form the grid-like metal grid pattern 152 together. The vertical extending portion 1521 is disposed corresponding to the DC power signal wire VDD, and the horizontal extending portion 1522 partially overlaps the second electrode plate C2, so that the wires transmitting the DC power signals are correspondingly disposed.

The metal grid pattern 152 is electrically connected with multiple DC power signal wires VDD, so that the metal grid pattern 152 transmits DC voltage signals, thereby reducing an ohmic drop during the transmission process of the DC power signals transmitted by the DC power signal wire VDD.

The second anode leading wire 153 is disposed right above the first anode leading wire 144 and is connected with the first anode leading wire 144 through a through hole penetrating the fourth insulation layer 110. The second anode leading wire 153 is disposed separately with the metal shielding patterns 151 in the area 1011a corresponding to the plurality of second pixel driving circuits 1011. The plurality of transparent wires 102 is located above the patterned fourth metal layer 15 and is electrically connected with the second anode leading wire 153. The transparent wire 102 connects the second anode leading wire 153 and the anode of the light emitting device OLED, thereby electrically connecting a plurality of light emitting devices OLED and a part of the second pixel driving circuits 1011.

Because the plurality of second pixel driving circuits 1011 are concentratedly disrupted in an island-like pattern, the transparent wires 102 disposed corresponding to the pixel driving circuit islands 101 are larger in number, a part of the transparent wires 102 overlap the gate leading wire that is electrically connected with the gates of the driving transistors of the second pixel driving circuits 1011 in the pixel driving circuit island 101. In addition, the transparent wires 102 are densely and unevenly distributed, so that overlapping areas between the different gate leads and the transparent wire 102 differgate. Therefore, the metal shielding pattern 151 in the area 1011a corresponding to the plurality of second pixel driving circuits 1011 is disposed in the transitional display area 100b. In a direction of a thickness of the display device, the metal shielding pattern 151 in the area 1011a corresponding to the plurality of second pixel driving circuits is disposed between the plurality of gate leading wires 141 and the plurality of transparent wires 102, and the metal shielding pattern 151 in the area 1011a corresponding to the plurality of second pixel driving circuits 1011 is disposed corresponding to the gate leading wire 141. The metal shielding pattern 151 in the area 1011a corresponding to the plurality of second pixel driving circuits 1011 blocks a parasitic capacitance between the gate leading wire 141 and the transparent wire 102, thereby preventing the parasitic capacitance from making a potential of the gate of the driving transistor M1 unstable, thereby preventing a difference between the parasitic capacitances from causing the parasitic capacitances to have a great difference in their influences on a potential of the gate of the driving transistor M1, thereby improving a working stability of the driving transistor M1, and thereby preventing a problem of unevenness in display from occurring in the display light transmission area 100a of the display device.

In the present embodiment, the metal shielding pattern 151 is disposed in a same layer as the metal grid pattern 152 and extends from the metal grid pattern 152, thereby making the DC power signals be loaded into the metal shielding pattern 151.

In the present embodiment, as shown in FIG. 13, the display device comprises a metal reflective pattern 103. The metal reflective pattern 103 is disposed in the transitional display area 100b and is located at intervals between the plurality of second pixel driving circuits 1011. That is, the metal reflective pattern 103 is located in areas between adjacent pixel driving circuit islands 101, the areas between the pixel driving circuit islands 101 and the main display area 100c, and the areas between the pixel driving circuit islands 101 and the display light transmission area 100a, thereby increasing a reflectance of the areas between the plurality of second pixel driving circuits 1011. The metal reflective pattern 103 is equivalent to or is similar to a first predetermined metal pattern 15a disposed in an area corresponding to the plurality of second pixel driving circuits 1011. The first predetermined metal pattern 15a may be a plurality of patterned first metal layer 12, a plurality of patterned second metal layer 13, a plurality of patterned third metal layer 14, a plurality of patterned fourth metal layer 15, and combination thereof, disposed in the area corresponding to the plurality of second pixel driving circuits 1011.

It is to be noted that, in the present disclosure, "the metal reflective pattern 103 is equivalent to the first predetermined metal pattern 15a" means that the metal reflective pattern 103 and the first predetermined metal pattern 15a are equivalent to each other in their metal pattern designs and sizes of their metal patterns, "the metal reflective pattern 103 is similar to the first predetermined metal pattern 15a" means that the metal reflective pattern 103 and the first predetermined metal pattern 15a are similar to each other in their metal pattern designs and sizes of their metal patterns, and the difference between the two has minor impact on their reflectance. For example, two metal patterns in the first predetermined metal pattern 15a are spaced apart from each other, and the same two metal patterns in the metal reflective pattern are connected with each other. Alternatively, the first predetermined metal pattern 15a is a square, and the metal reflective pattern 103 is a square with round chamfers.

Specifically, because in the area corresponding to the plurality of second pixel driving circuits 1011, the patterned fourth metal layer 15 is a metal layer located at an upper level, and because the patterned fourth metal layer 15 occupies a larger portion in the area corresponding to each of the second pixel driving circuits 1011, the patterned fourth metal layer 15 directly affects the reflectance of the corresponding area 1011a of the second pixel driving circuits 1011. In the present embodiment, the first predetermined metal pattern 15a is the plurality of patterned fourth metal layers 15 in the corresponding area of the plurality of second pixel driving circuits 1011. That is, the first predetermined metal pattern 15a is located above the plurality of second pixel driving circuits 1011. The first predetermined metal pattern 15a includes the plurality of patterned fourth metal layers 15. Because the plurality of second pixel driving circuits 1011 are disposed in the plurality of pixel driving circuit islands 101 as shown in FIG. 4, the plurality of patterned fourth metal layers 15 disposed corresponding to one pixel driving circuit island 101 are concentratedly disposed and are connected to one another, and the plurality of patterned fourth metal layer 15 disposed corresponding to multiple pixel driving circuit islands 101 are spaced-apart.

In the present embodiment, the metal reflective pattern 103 and the first predetermined metal pattern 15a are disposed in a same metal layer, thereby making a reflectance of a position where the metal reflective pattern 103 is disposed and a reflectance of a position where the first predetermined metal pattern 15a is disposed in the display device nearly the same, and thereby favoring a reflectance of the area corresponding to the plurality of second pixel driving circuits 1011 and a reflectance of the intervals between the second pixel driving circuits 1011 to be nearly the same. The reflectances of the transitional display area 100b are nearly uniform.

In the present embodiment, the first predetermined metal pattern 15a includes a first metal pattern and a second metal pattern spaced apart from each other and disposed in a same layer. Correspondingly, the metal reflective pattern 103 includes the first metal pattern and the second metal pattern, thereby making the first predetermined metal pattern 15a and the metal reflective pattern 103 nearly the same. The first metal pattern is the metal grid pattern 152 and the metal shielding pattern 151 formed by the plurality of patterned fourth metal layer 15. The second metal pattern and the first metal pattern are disposed in a same layer, and the second metal pattern of the first predetermined metal pattern 15a is the second anode leading wire 153 connected with the second pixel driving circuits 1011. That is, the second metal pattern is electrically connected with the anode of the light emitting diode. The first metal pattern of the metal reflective pattern 103 includes the metal grid pattern 152 and the metal shielding pattern 151. The second metal pattern of the metal reflective pattern 103 is equivalent to the second anode leading wire 153 connected with the second pixel driving circuits 1011. The metal shielding pattern 151 of the metal reflective pattern 103 extends from the metal grid pattern 152 of the metal reflective pattern 103. Relative positions between the metal grid pattern 152 of the first predetermined metal pattern 15a and the metal shielding pattern 151 of the first predetermined metal pattern 15a are equivalent to relative positions between the metal grid pattern 152 of the metal reflective pattern 103 and the metal shielding pattern 151 of the metal reflective pattern 103.

In the present embodiment, a ratio of an area of the first metal pattern of the first predetermined metal pattern 15a to the area 1011a corresponding to the plurality of second pixel driving circuits 1011 is different from a ratio of an area of the second metal pattern to the area 1011a corresponding to the plurality of second pixel driving circuits 1011. Specifically, a ratio of an area of the first metal pattern formed by the metal grid pattern 152 and the metal shielding pattern 151 to the area 1011a corresponding to the plurality of second pixel driving circuits 1011 is larger than a ratio of an area of the plurality of second anode leading wire 153 of the first predetermined metal pattern 15a to the area 1011a corresponding to the plurality of second pixel driving circuits 1011.

In the present embodiment, relative positions between the first metal pattern of the first predetermined metal pattern 15a and the second metal pattern of the first predetermined metal pattern 15a are equivalent to relative positions between the first metal pattern of the metal reflective pattern 103 and the second metal pattern of the metal reflective pattern 103. That is, in the first predetermined metal pattern 15a, the first metal pattern formed by the metal grid pattern 152 and the metal shielding pattern 151, and an arrangement of the first anode leading wire 153 of the first predetermined metal pattern 15a, are equivalent to those in the metal reflective pattern 103, thereby making a reflectance distribution of the first predetermined metal pattern 15a and a reflectance distribution of the metal reflective pattern 103 equivalent to each other.

In the present embodiment, the first metal pattern formed by the metal grid pattern 152 and the metal shielding pattern 151 of the metal reflective pattern 103 is connected with the second metal pattern 153 of the metal reflective pattern 103, and the metal reflective pattern 103 transmits a first DC signal, so that the first metal pattern formed by the metal grid pattern 152 and the metal shielding pattern 151 of the metal reflective pattern 103 transmits a constant voltage signal equivalent to that transmitted by the second metal pattern 153, and thereby preventing the metal reflective pattern 103 from being floating.

In the present embodiment, the metal reflective pattern 103 is located in a single metal layer, the first metal pattern of the metal reflective pattern 103 and the first metal pattern of the first predetermined metal pattern disposed in the area 1011a corresponding to the second pixel driving circuits 1011 are disposed in a same layer and are connected to each other, so that the first metal pattern of the metal reflective pattern 103 and the first metal pattern of the first predetermined metal pattern 15a transmit the same electrical signals.

In the present embodiment, as shown in FIG. 12 and FIG. 13, a second predetermined metal pattern 15b is disposed in the main display area 100c and is disposed in a same layer as the first predetermined metal pattern 15a. The second predetermined metal pattern 15b is formed by the metal grid pattern 152 for transmitting the DC power signals and an anode leading wire 154 connected with the first pixel driving circuits 104. The anode leading wire 154 connected with the first pixel driving circuits 104 is spaced apart from the metal grid pattern 152 of the second predetermined metal pattern 15b. Because the second predetermined metal pattern 15b does not include the metal shielding pattern, a ratio of an area of metal of the second predetermined metal pattern 15b to the main display area 100c is less than a ratio of an area of metal of the first predetermined metal pattern 15a to the area 1011a corresponding to the plurality of second pixel driving circuits 1011. The anode leading wire 154 electrically connected with the first pixel driving circuits 104 is equivalent to or is similar to the second anode leading wire 153 electrically connected with the second pixel driving circuits 1011.

Specifically, as shown in FIG. 12, a connecting through hole 110a is formed in the fourth insulation layer 110 of the main display area 100c. The metal grid pattern 152 of the main display area 100c and the DC power signal wire VDD of the main display area 100c is electrically connected with each other through the connecting through hole 110a. The metal grid pattern 152 of the second predetermined metal pattern 15b is connected with the metal grid pattern 152 of the metal reflective pattern 103, thereby making the metal grid patterns 152 disposed in the main display area 100c, above the plurality of second pixel driving circuits 1011 of the transitional display area 100b, and at intervals between the plurality of second pixel driving circuits 1011 of the transitional display area 100b, connected with one another and transmits the DC power signals.

It is noted that, the metal grid patterns 152 disposed in the main display area 100c, above the plurality of second pixel driving circuits 1011 in the transitional display area 100b, and at the intervals between the plurality of second pixel driving circuits 1011 in the transitional display area 100b, makes the reflectance of the main display area 100c and the reflectance of the transitional display area 100b of the display device 100 nearly the same, and makes the DC power signals of the display device 100 nearly the same between the main display area 100c and the transitional display area 100b. Therefore, the technical solution of the present disclosure can also make the reflectance of the transitional display area 100b and the reflectance of the main display area 100c nearly the same, while making the reflectance of the transitional display area 100b uniform.

The display device 100 of the present disclosure further comprises a light sensing unit (not shown), the light sensing unit is disposed corresponding to the display light transmission area 100a. The light sensing unit may be a camera.

The above embodiments are used to assist in understanding the technical solutions and the core ideas of the disclosure. Those of ordinary skill in the art should understand that the technical solutions described in the foregoing embodiments can be modified, or some of the technical features can be replaced. These modifications and replacements do not substantially deviate the corresponding technical solutions from the scopes of the technical solutions of the embodiments of the present disclosure.

What is claimed is:

1. A display device, wherein the display device has a transitional display area and a display light transmission area, and the transitional display area is disposed at a periphery of the display light transmission area, the display device comprises:
   display pixels disposed in the transitional display area and the display light transmission area;
   a plurality of pixel driving circuits disposed in the transitional display area, for driving the display pixels in the transitional display area and the display light transmission area to emit light; and
   a metal reflective pattern disposed in the transitional display area and located at intervals between the plurality of pixel driving circuits;
   wherein a first predetermined metal pattern is disposed in an area corresponding to the plurality of pixel driving circuits, and the metal reflective pattern is equivalent to or is similar to the first predetermined metal pattern.

2. The display device as claimed in claim 1, wherein the first predetermined metal pattern is disposed above the plurality of pixel driving circuits, and the metal reflective pattern is disposed in a same metal layer as the first predetermined metal pattern.

3. The display device as claimed in claim 1, wherein the first predetermined metal pattern includes a first metal pattern and a second metal pattern spaced apart from each other and located in a same metal layer;
   and wherein the metal reflective pattern includes the first metal pattern and the second metal pattern.

4. The display device as claimed in claim 3, wherein relative positions between the first metal pattern of the first predetermined metal pattern and the second metal pattern of the first predetermined metal pattern are equivalent to relative positions between the first metal pattern of the metal reflective pattern and the second metal pattern of the metal reflective pattern.

5. The display device as claimed in claim 3, wherein the first metal pattern of the metal reflective pattern is connected with the second metal pattern of the metal reflective pattern, and the metal reflective pattern transmits a first DC signal.

6. The display device as claimed in claim 3, wherein a ratio of an area of the first metal pattern of the first predetermined metal pattern to the area corresponding to the plurality of pixel driving circuits is different from a ratio of an area of the second metal pattern to the area corresponding to the plurality of pixel driving circuits.

7. The display device as claimed in claim 3, wherein the first metal pattern of the first predetermined metal pattern includes a metal grid pattern for transmitting a second DC signals, and the first metal pattern of the metal reflective pattern includes the metal grid pattern;
   wherein the first metal pattern of the metal reflective pattern is connected with the first metal pattern of the first predetermined metal pattern.

8. The display device as claimed in claim 7, wherein the first metal pattern of the first predetermined metal pattern further includes a metal shielding pattern for shielding, and the first metal pattern of the metal reflective pattern further includes the metal shielding pattern;
   and wherein relative positions between the metal grid pattern of the first predetermined metal pattern and the metal shielding pattern of the first predetermined metal pattern are equivalent to relative positions between the metal grid pattern of the metal reflective pattern and the metal shielding pattern of the metal reflective pattern.

9. The display device as claimed in claim 8, wherein the metal shielding pattern of the first predetermined metal pattern extends from the metal grid pattern of the first predetermined metal pattern, and the metal shielding pattern of the metal reflective pattern extends from the metal grid pattern of the metal reflective pattern.

10. The display device as claimed in claim 8, further comprising:
    a plurality of transparent wires disposed above the plurality of pixel driving circuits and electrically connected to a part of the pixel driving circuits and to the plurality of display pixels disposed in the display light transmission area;
    wherein each of the pixel driving circuits includes:
    a driving transistor including a gate; and
    a gate leading wire electrically connected with the gate of the driving transistor;
    wherein in a direction of a thickness of the display device, the metal shielding pattern disposed in the area corresponding to the plurality of pixel driving circuits is located between the gate leading wire and the plurality of transparent wires, and is disposed to correspond to the gate leading wire.

11. The display device as claimed in claim 7, further comprising:
    a plurality of DC power signal wires electrically connected with the metal grid pattern of the first predetermined metal pattern.

12. The display device as claimed in claim 3, wherein each of the display pixels includes a light emitting diode, and the second metal pattern of the first predetermined metal pattern is electrically connected with an anode of the light emitting diode.

13. The display device as claimed in claim 1, further comprising: a main display area;

wherein the transitional display area is disposed between the main display area and the display light transmission area, a second predetermined metal pattern is disposed in the main display area and is disposed in a same layer as the first predetermined metal pattern, and a ratio of an area of metal of the second predetermined metal pattern to the main display area is less than a ratio of an area of metal of the first predetermined metal pattern to the area corresponding to the plurality of pixel driving circuits.

14. The display device as claimed in claim 13, wherein the second predetermined metal pattern includes the metal grid pattern and an anode leading wire for transmitting the second DC signals, and the anode leading wire is spaced apart from the metal grid pattern of the second predetermined metal pattern.

15. The display device as claimed in claim 1, wherein the plurality of pixel driving circuits form a plurality of pixel driving circuit islands, and the plurality of pixel driving circuit islands are disposed around the display light transmission area.

\* \* \* \* \*